United States Patent [19]

Kawashima

[11] Patent Number: 4,472,655
[45] Date of Patent: Sep. 18, 1984

[54] TUNING FORK FLEXURAL QUARTZ RESONATOR

[75] Inventor: Hirofumi Kawashima, Tokyo, Japan

[73] Assignee: Kabushiki Kaisha Daini Seikosha, Tokyo, Japan

[21] Appl. No.: 478,885

[22] Filed: Mar. 25, 1983

[51] Int. Cl.³ .......................................... H01L 41/08
[52] U.S. Cl. .................................. 310/361; 310/270; 374/117; 331/66; 331/73
[58] Field of Search ...................... 310/360, 361, 370; 73/339 A, 341

[56] References Cited

U.S. PATENT DOCUMENTS

| | | | |
|---|---|---|---|
| 2,274,079 | 2/1942 | Mason | 310/361 |
| 3,375,379 | 3/1968 | Royer | 310/361 |
| 4,148,530 | 4/1979 | Calderara | 310/361 |
| 4,320,320 | 3/1982 | Momosaki et al. | 310/361 |
| 4,355,257 | 10/1982 | Kawashima et al. | 310/361 |

Primary Examiner—Mark O. Budd
Attorney, Agent, or Firm—Robert E. Burns; Emmanuel J. Lobato; Bruce L. Adams

[57] ABSTRACT

A tuning fork flexural quartz resonator is cut out from a Z plate rotated at 25°–165° around the X-axis as the rotary axis. The resonator with an excellent frequency sensitivity of about −100 ppm/°C. is obtained when the cut angle θ is 120°.

18 Claims, 8 Drawing Figures

TUNING FORK FLEXURAL QUARTZ RESONATOR

BACKGROUND OF THE INVENTION

The present invention relates to a tuning fork flexural quartz resonator suitable for use in a thermometer, and more particularly to the cut angle of the quartz resonator.

Generally, a mercury glass thermometer has been widely used because of its accuracy, low price, convenience, etc. The mercury thermometer, however, has several drawbacks. Namely, it is difficult to take baby's and infant's tempratures because of the long time required to take a temperature measurement. It is troublesome to lower the temperature reading after taking a measurement by swining the thermometer. Further, the thermometer is easily broken. Although a thermister thermometer which overcame the above-noted drawbacks has been recently put on the market, the temperature and resistance do not exhibit a linear relationship. Further, since the dispersion of elements during the manufacturing process exists in the thermister thermometer, the elements thereof are difficult to be interchanged with each other. Although the time to take a temperature measurement by the thermister thermister has been shortened as compared to that of the mercury thermometer, it still takes about 1-2 minutes and thus is unsatisfactory.

BRIEF SUMMARY OF INVENTION

Accordingly, it is an object of the present invention to provide a tuning fork flexural quartz resonator ureable as a temperature sensor of a thermometer.

It is another object of the invention to provide a tuning fork flexural quartz resonator for use in a thermometer and which has a large frequency variation for charges in temperature, i.e. has excellent sensitivity, by selecting the optimum cut angle.

It is another object of the invention to provide an electronic thermometer having a short temperature-taking time.

These and other objects, features and advantages of the invention will become more apparent upon a reading of the following detailed specification and drawings.

DESCRIPTION OF THE PREFERRED EMBODIMENTS

The properties required for a thermometer are as follows:

(1) Small and light for realizing an excellent thermal response.

(2) Excellent frequency sensitivity for changes in temperature.

Of these, property (1) is satisfied by the recent development of a considerably small quartz crystal unit as the oscillation source of a wrist watch using a tuning fork quartz resonator.

Figure 1:
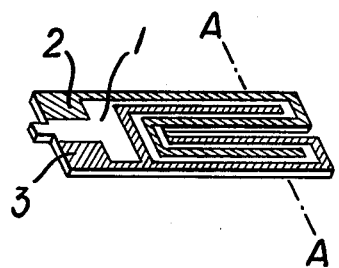
FIG. 1 is a perspective view showing an embodiment of electrode arrangement of a tuning fork quartz resonator according to the present invention.

FIG. 1 shows a perspective view of an embodiment of electrode arrangement of a tuning fork flexural quartz resonator according to the present invention. Exciting electrodes 2 and 3 are arranged as shown on a tuning fork quartz crystal 1.

Figure 2:
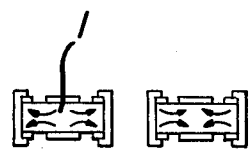
FIG. 2 is a section taken on line A—A of FIG. 1.

FIG. 2 shows a section taken on line A—A of FIG. 1, in which the exciting electrodes are arranged on the rear and side surfaces of the tuning fork quartz crystal 1. The electric field is applied in the direction of arrows by application of d.c. voltage to the electrodes. The direction of the electric field is reversed by application of a.c. voltage and the tuning fork quartz crystal is excited to vibrate in the flexural mode.

Figure 3:
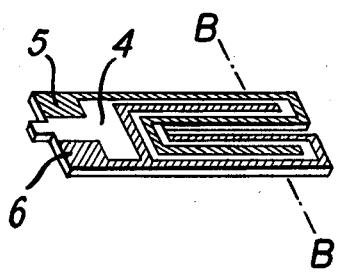
FIG. 3 is a perspective view showing another embodiment of electrode arrangement of a tuning fork quartz resonator according to the present invention.

FIG. 3 is a perspective view of another embodiment showing the electrode arrangement of the tuning fork flexural quartz resonator according to the present invention, in which exciting electrodes 5 and 6 are arranged as shown on both major surfaces of a tuning fork quartz crystal 4.

Figure 4:
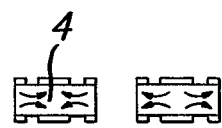
FIG. 4 is a section taken on line B—B of FIG. 3.

FIG. 4 is a section taken on line B—B of FIG. 3. The electric field is applied in the direction of arrows by application of d.c. voltage, and the direction of the electric field is reversed by application of a.c. voltage in a similar manner to FIG. 2 so that the tuning fork quartz crystal is excited to vibrate in the flexural mode.

Figure 5:
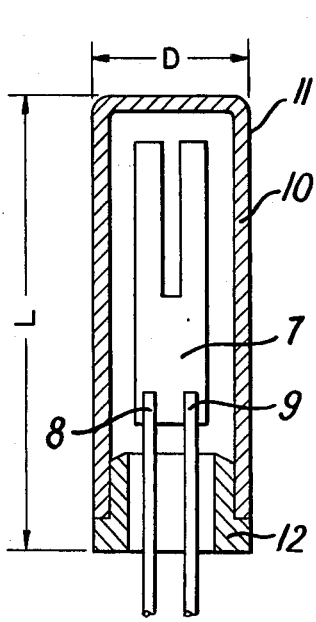
FIG. 5 is a section of a quartz resonator unit according to the present invention.

FIG. 5 shows a quartz resonator unit according to the present invention comprising a stem 12 and an enclosure member in the form of a cap 10. A tuning fork flexural quartz resonator 7 is secured to supporting lead wires 8 and 9 by solder or adhesives. The cap 10 is made of german silver (65% Cu—10% Ni—25% Zn) which is insufficient in heat conductive and thus a material with excellent heat conductivity, e.g. Au 11 is plated on a partial or the overall surface of the cap. Bodily temperature is taken by the resonance frequency of the tuning fork quartz resonator through the Au plating. Since the quartz crystal unit of about 1.5 mm $\phi$ diameter D and 6 mm length L is extremely small, the mass is small and the heat response is excellent.

Figure 6:
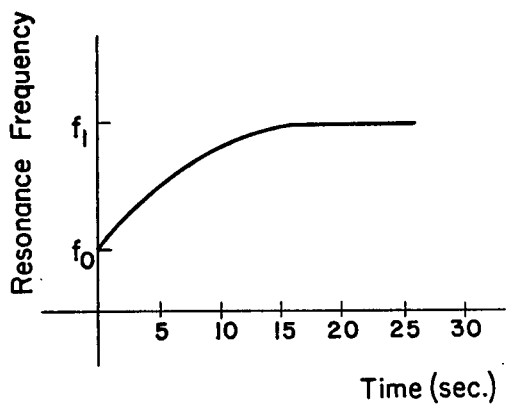
FIG. 6 is a graph showing the relationship between the resonance frequency and time for stabilizing the resonance frequency when the temperature changes from room temperature to about 40° C.

FIG. 6 shows the relationship between the resonance frequency and time taken to stabilize the resonance frequency when the temperature changes from room temperature to about 40° C. The graph shows that the time taken to change from the resonance frequency $f_0$ at room temperature to the resonance frequency $f_1$ at about 40° C. is about 15-20 sec. This means that the thermal response of the quartz crystal unit is extremely excellent in comparison with the conventional element.

As mentioned above, it is also necessary that property (2), i.e. the frequency sensitivity versus temperature, should be satisfied. The tuning fork flexural resonator with the frequency sensitivity of more than 20 ppm/°C. (absolute value) is generally needed.

Figure 7:
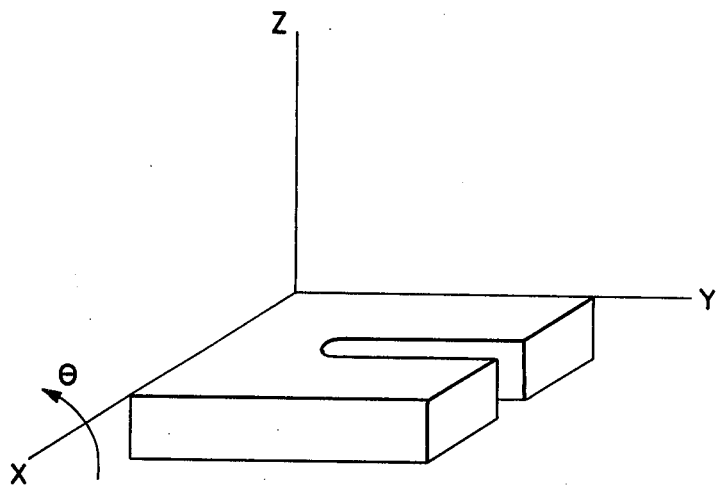
FIG. 7 is a perspective view showing an embodiment of a tuning fork quartz resonator formed from a Z plate according to the present invention.

FIG. 7 shows an embodiment of the tuning fork flexural resonator formed from a Z-plate.

Figure 8:
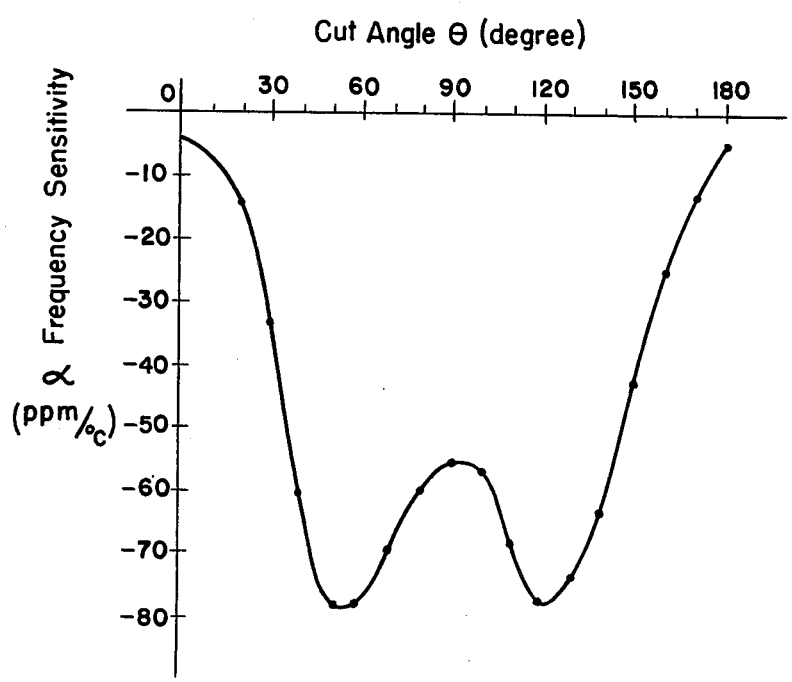
FIG. 8 is a graph showing the theoretical relationship between the cut angle $\theta$ and the frequency sensitivity $\alpha$ when the tuning fork flexural quartz resonator in FIG. 7 is rotated at $\theta$ about the X axis as the rotary axis.

FIG. 8 shows the theoretical relationship between the cut angle $\theta$ and the frequency sensitivity $\alpha$ when the tuning fork flexural quartz resonator in FIG. 7 is rotated at $\theta$ about the X-axis as the rotary axis (counter-clockwise is positive). The frequency sensitivity $\alpha$ increases as $\theta$ becomes larger. The cut angle $\theta$=about 25° when $\alpha$=20 ppm/°C. and $\alpha$ increases as $\theta$ becomes larger, and when $\theta$ is between 50° and 60°, $\alpha$ is about −80 ppm/°C. which is the maximum value. When the cut angle $\theta$ is more than 60°, $\alpha$ becomes smaller and $\alpha$ is at minimum when $\theta$ is about 90°. When the cut angle is more than 90°, $\alpha$ becomes larger again and $\alpha$ is at maximum when $\theta$ is about 120°. The absolute value of $\alpha$ is smaller as the cut angle $\theta$ becomes larger. The cut angle $\theta$ is about 165° when $\alpha$ is about −20 ppm/°C.

Although the relationship between $\theta$ and $\alpha$ illustrated above is theoretical, a tuning fork flexural quartz crystal resonator with an extremely excellent frequency sensitivity $\alpha \approx -100$ ppm/°C. can be obtained when the cut angle $\theta = 120°$ according to the present invention. More specifically, when the resonance frequency $f_2 = 32768$ Hz is used for time counting, the resonance frequency $f_3 = 100,000$ Hz is used for taking temperature, and the frequency sensitivity $\alpha$ is −100 ppm/°C., and this results in an excellent thermometer with temperature resolution of 0.1° C. by 1 second measuring. Simultaneously the temperature taking time is shortened to over ten minutes including measuring time, which is ¼ to ⅛ that of the conventional thermister thermometer. The temperature resolution is decided by the frequency sensitivity, the resonance frequency for time counting and the resonance frequency for taking temperature. The resolution becomes higher as the frequency sensitivity and the resonance frequencies are higher.

As illustrated, the present invention provides a tuning fork flexural quart resonator with excellent frequency sensitivity by selecting the optimum cut angle thereof. An accurate thermometer of having a short temperature taking time and excellent resolution can be provided by the use of the tuning fork flexural quartz resonator as a temperature sensor of thermometer. As a result, baby's and infant's temperatures are easily taken.

What I claim is:

1. A tuning fork flexural quartz resonator comprising: a quartz resonator having a tuning fork shape and being cut out from a Z plate rotated at 25°–165° around the X-axis as a rotary axis so as to be vibratable in a flexural mode, the resonator having a frequency sensitivity versus temperature characteristic the absolute value of which is more than 20 ppm/°C.

2. A tuning fork flexural quartz resonator as claimed in claim 1; wherein the resonator is suitable for use as a temperature sensor of a thermometer.

3. A tuning fork flexural quartz resonator as claimed in claim 1; including exciting electrodes disposed on upper, lower and side surfaces of the resonator.

4. A tuning fork flexural quartz resonator as claimed in claim 2; wherein said resonator is supported by two lead wires and is enclosed in a cylindrical capsule.

5. A tuning fork flexural mode quartz resonator suitable for use as the temperature-measuring element of an electronic thermometer comprising: a quartz plate cut from a Z plate rotated through an angle of 25°–165° about the X-axis, the quartz plate having a tuning fork shape including a pair of vibratable tuning fork arms vibratable in a flexural mode during use of the resonator, the resonator having a frequency sensitivity/temperature characteristic greater than |20| ppm/°C.

6. A tuning fork flexural mode quartz resonator according to claim 5; including a set of exciting electrodes disposed on preselected surface portions of the tuning fork shaped quartz plate at positions effective to excite the tuning fork arms into flexural mode vibration during use of the resonator.

7. A tuning fork flexural mode quartz resonator according to claim 6; wherein the tuning fork shaped quartz plate has opposed major surfaces and side surfaces, and wherein the set of exciting electrodes comprising exciting electrodes disposed on at least one of the opposed major surfaces.

8. A tuning fork flexural mode quartz resonator according to claim 7; wherein the set of exciting electrodes comprises exciting electrodes disposed on both opposed major surfaces.

9. A tuning fork flexural mode quartz resonator according to claim 8; wherein the set of exciting electrodes includes exciting electrodes disposed on the side surfaces.

10. A tuning fork flexural mode quartz resonator according to claim 7; wherein the set of exciting electrodes includes exciting electrodes disposed on the side surfaces.

11. A tuning fork flexural mode quartz resonator according to claim 7; further including an enclosure member in which is disposed the resonator, and a set of lead wires connected to the set of exciting electrodes and projecting out of the enclosure member.

12. In an electronic thermometer for measuring body temperature: temperature-measuring means for measuring body temperature and producing a corresponding electrical signal representative of the measured temperature, the temperature-measuring means comprising a tuning fork flexural mode quartz resonator comprised of a quartz plate cut from a Z plate rotated through an angle of 25°–165° about the X-axis, the quartz plate having a tuning fork shape including a pair of vibrationally excited tuning fork arms vibratable in a flexural mode, the resonator having a frequency sensitivity/temperature characteristic greater than |20| ppm/°C.

13. An electronic thermometer according to claim 12; including a set of exciting electrodes disposed on preselected surface portions of the tuning fork shaped quartz plate at positions effective to excite the tuning fork arms into flexural mode vibration.

14. An electronic thermometer according to claim 13; wherein the tuning fork shaped quartz plate has opposed major surfaces and side surfaces, and wherein the set of exciting electrodes comprises exciting electrodes disposed on at least one of the opposed major surfaces.

15. An electronic thermometer according to claim 14; wherein the set of exciting electrodes comprises exciting electrodes disposed on both opposed major surfaces.

16. An electronic thermometer according to claim 15; wherein the set of exciting electrodes includes exciting electrodes disposed on the side surfaces.

17. An electronic thermometer according to claim 14; wherein the set of exciting electrodes includes exciting electrodes disposed on the side surfaces.

18. An electronic thermometer according to claim 14; further including an enclosure member in which is disposed the resonator, and a set of lead wires connected to the set of exciting electrodes and projecting out of the enclosure member.

* * * * *